(12) United States Patent
Miao et al.

(10) Patent No.: US 11,101,181 B2
(45) Date of Patent: Aug. 24, 2021

(54) JUNCTION FORMATION IN THICK-OXIDE AND THIN-OXIDE VERTICAL FETS ON THE SAME CHIP

(71) Applicant: International Business Machines Corporation, Armonk, NY (US)

(72) Inventors: Xin Miao, Slingerlands, NY (US); Kangguo Cheng, Schenectady, NY (US); Wenyu Xu, Albany, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 16/743,216

(22) Filed: Jan. 15, 2020

(65) Prior Publication Data
US 2020/0152517 A1    May 14, 2020

Related U.S. Application Data

(62) Division of application No. 15/854,229, filed on Dec. 26, 2017, now Pat. No. 10,607,892.

(51) Int. Cl.
*H01L 21/8234* (2006.01)
*H01L 27/088* (2006.01)
(Continued)

(52) U.S. Cl.
CPC ............... *H01L 21/823462* (2013.01); *H01L 21/823487* (2013.01); *H01L 27/088* (2013.01);
(Continued)

(58) Field of Classification Search
CPC ..... H01L 21/823462; H01L 21/823487; H01L 27/088; H01L 29/66545; H01L 29/6656;
(Continued)

(56) References Cited

U.S. PATENT DOCUMENTS

| 6,191,444 B1 | 2/2001 | Clampitt et al. |
| 6,414,351 B2 | 7/2002 | Clampitt et al. |

(Continued)

FOREIGN PATENT DOCUMENTS

| EP | 3070737 A1 | 9/2016 |
| WO | 2005055326 A1 | 6/2005 |

OTHER PUBLICATIONS

List of IBM Patents or Patent Applications Treated as Related.

*Primary Examiner* — Peter Bradford
(74) *Attorney, Agent, or Firm* — Randall Bluestone; Ryan, Mason & Lewis, LLP

(57) ABSTRACT

A method for manufacturing a semiconductor device includes forming a first plurality of fins in a first device region on a substrate, forming a second plurality of fins in a second device region on the substrate, forming bottom source/drain regions on the substrate and around lower portions of each of the first and second plurality of fins in the first and second device regions, forming a dummy spacer layer on the bottom source/drain region in the first device region, wherein the dummy spacer layer includes one or more dopants, and forming a plurality of doped regions in the first and second plurality of fins in the first and second device regions, wherein the plurality of doped regions in the first device region extend to a greater height on the first plurality of fins than the plurality of doped regions in the second device region on the second plurality of fins.

20 Claims, 6 Drawing Sheets

(51) Int. Cl.
*H01L 29/66* (2006.01)
*H01L 29/78* (2006.01)
*H01L 29/08* (2006.01)

(52) U.S. Cl.
CPC .... *H01L 29/6656* (2013.01); *H01L 29/66545* (2013.01); *H01L 29/66666* (2013.01); *H01L 29/7827* (2013.01); *H01L 29/0847* (2013.01)

(58) Field of Classification Search
CPC ........... H01L 29/7827; H01L 29/66666; H01L 29/0847
See application file for complete search history.

(56) References Cited

U.S. PATENT DOCUMENTS

| | | | |
|---|---|---|---|
| 6,551,878 B2 | 4/2003 | Clampitt et al. | |
| 6,605,501 B1 | 8/2003 | Ang et al. | |
| 6,610,575 B1 | 8/2003 | Ang et al. | |
| 9,129,687 B2 | 9/2015 | Kurjanowicz | |
| 9,564,431 B2 | 2/2017 | Colinge et al. | |
| 9,570,579 B2 | 2/2017 | Colinge et al. | |
| 9,589,970 B1 | 3/2017 | Tseng et al. | |
| 9,871,041 B1 | 1/2018 | Cheng et al. | |
| 9,859,172 B1 | 6/2018 | Anderson et al. | |
| 10,002,793 B1 * | 6/2018 | Shu | H01L 21/823821 |
| 10,141,448 B1 | 11/2018 | Miao et al. | |
| 2006/0273389 A1 | 12/2006 | Cohen et al. | |
| 2007/0029623 A1 | 2/2007 | Liu et al. | |
| 2016/0343623 A1 * | 11/2016 | Fogel | H01L 29/66803 |
| 2017/0062427 A1 * | 3/2017 | Basker | H01L 21/823821 |
| 2017/0256409 A1 * | 9/2017 | Leobandung | H01L 29/16 |
| 2018/0006037 A1 | 1/2018 | Cheng et al. | |
| 2018/0197793 A1 * | 7/2018 | Guo | H01L 29/1033 |
| 2018/0337133 A1 * | 11/2018 | Zhang | H01L 29/66742 |

* cited by examiner

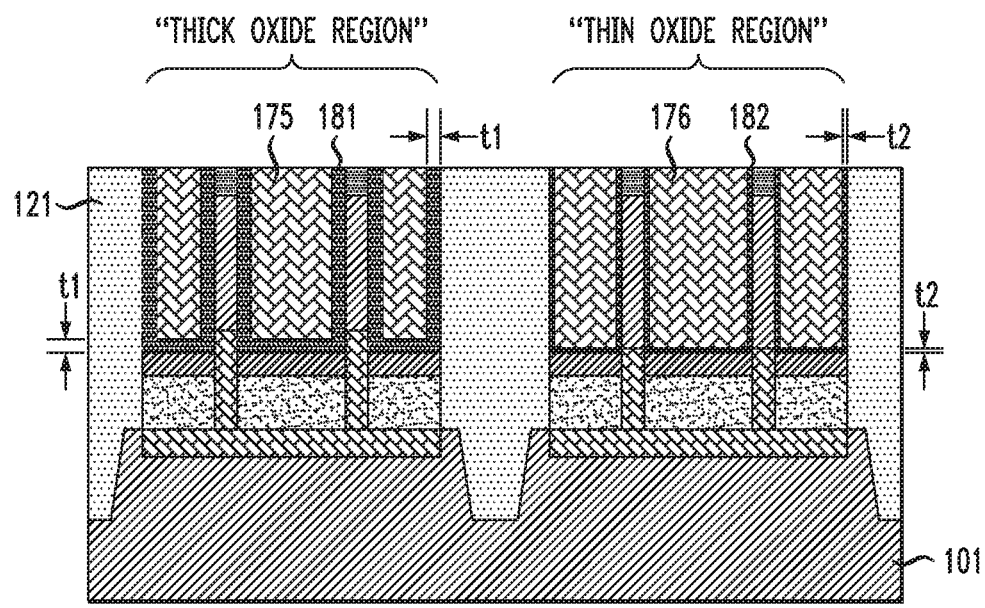
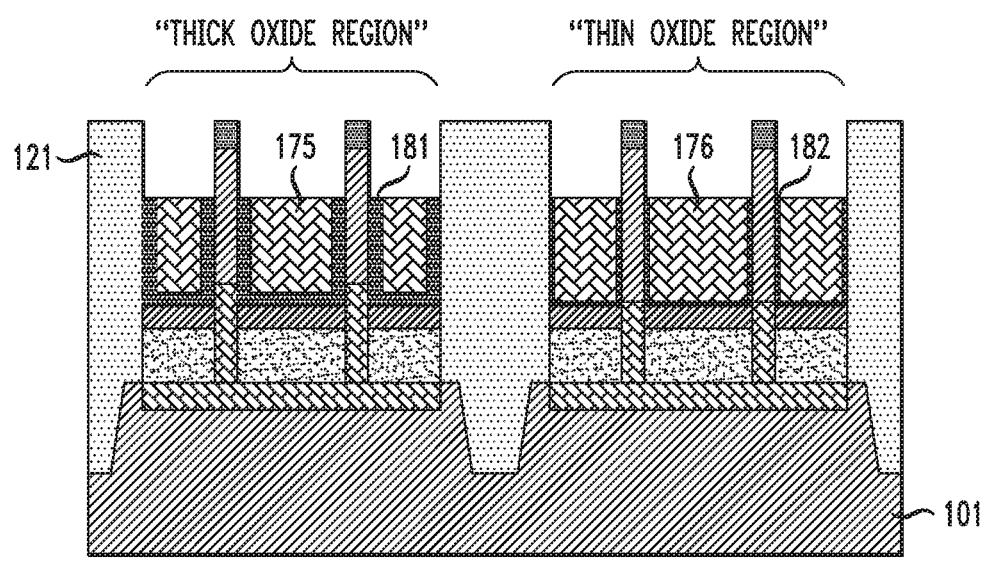

JUNCTION FORMATION IN THICK-OXIDE AND THIN-OXIDE VERTICAL FETS ON THE SAME CHIP

TECHNICAL FIELD

The field generally relates to semiconductor devices and methods of manufacturing same and, in particular, to forming different bottom source-drain junction profiles for thick-oxide and thin-oxide devices on a same substrate.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field effect transistors (VFETs) are becoming viable device options for semiconductor devices, for example, complementary metal oxide semiconductor (CMOS) devices, beyond 5 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch, providing a FinFET-equivalent density at a larger contacted poly pitch (CPP), and providing lower MOL resistance.

Due to a variety of applications, devices having both relatively thin and thick gate oxides are needed. For example, relatively thicker gate oxide devices are needed for technologies (e.g., input/output (I/O), analog, etc.) requiring higher drain supply voltage ($V_{dd}$). Due to the different gate oxide thicknesses, in order to avoid degraded performance, thick and thin gate oxide devices require different bottom source-drain junction profiles from each other.

SUMMARY

According to an exemplary embodiment of the present invention, a method for manufacturing a semiconductor device includes forming a first plurality of fins in a first device region on a substrate, forming a second plurality of fins in a second device region on the substrate, forming bottom source/drain regions on the substrate and around lower portions of each of the first and second plurality of fins in the first and second device regions, forming a dummy spacer layer on the bottom source/drain region in the first device region, wherein the dummy spacer layer includes one or more dopants, and forming a plurality of doped regions in the first and second plurality of fins in the first and second device regions, wherein the plurality of doped regions in the first device region extend to a greater height on the first plurality of fins than the plurality of doped regions in the second device region on the second plurality of fins.

According to an exemplary embodiment of the present invention, a semiconductor device includes a plurality of vertical transistors on a substrate, wherein each of the plurality of vertical transistors includes a channel region extending vertically from the substrate, wherein the channel region includes a junction portion extending vertically from a bottom of the channel region, a bottom source/drain region on the substrate and around a lower portion of the channel region, a gate structure on the bottom source/drain region, wherein the gate structure comprises a gate oxide layer, and a top source/drain region on the gate structure and extending from the channel region, wherein a junction portion corresponding to a first vertical transistor of the plurality of vertical transistors extends to a greater height above a corresponding bottom source/drain region of the first vertical transistor than a junction portion corresponding to a second vertical transistor of the plurality of vertical transistors.

According to an exemplary embodiment of the present invention, a method for manufacturing a semiconductor device includes forming a first plurality of channel regions in a first device region on a substrate, forming a second plurality of channel regions in a second device region on the substrate, forming bottom source/drain regions on the substrate and around lower portions of each of the first and second plurality of channel regions in the first and second device regions, forming a dummy spacer layer on the bottom source/drain region in the first device region, wherein the dummy spacer layer includes one or more dopants, and forming a plurality of junction portions in the first and second plurality of channel regions in the first and second device regions, wherein the plurality of junction portions in the first device region extend to a greater height above the bottom source/drain regions than the plurality of junction portions in the second device region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 9 is a cross-sectional view of gate structure formation in a method of manufacturing a semiconductor device, according to an exemplary embodiment of the present invention.

FIG. 10 is a cross-sectional view of recessing of gate structures in a method of manufacturing a semiconductor device, according to an exemplary embodiment of the present invention.

DETAILED DESCRIPTION

Figure 1:
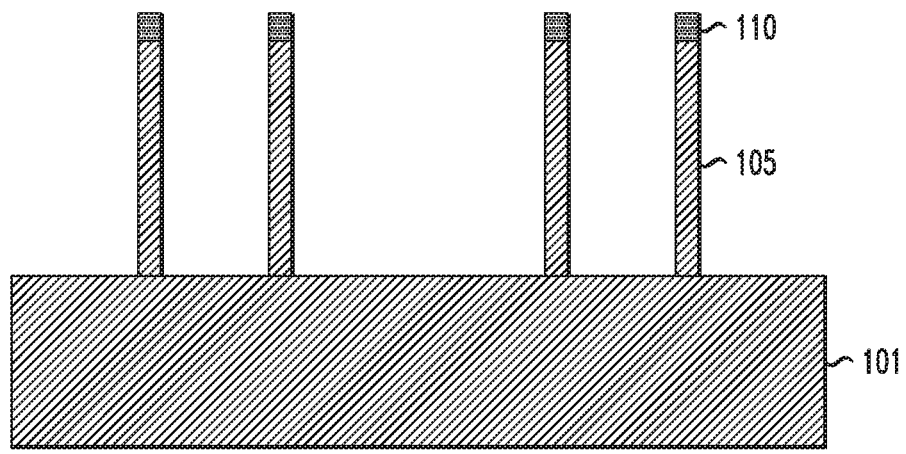
FIG. 1 is a cross-sectional view of fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to different bottom source-drain junction profiles depending on a thickness of a gate oxide in vertical transistors on the same substrate.

It is to be understood that the various layers and/or regions shown in the accompanying drawings are not drawn to scale, and that one or more layers and/or regions of a type commonly used in, for example, a complementary metal-oxide semiconductor (CMOS), nanowire field-effect transistor (FET), fin field-effect transistor (FinFET), metal-oxide-semiconductor field-effect transistor (MOSFET), VFET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, VFETs, nanowire FETs, nanosheet FETs, SETs, CMOSs, MOSFETs and/or FinFETs. By way of non-limiting example, the semiconductor devices can include, but are not limited to VFET, nanowire FET, nanosheet FET, SET, CMOS, MOSFET and FinFET devices, and/or semiconductor devices that use CMOS, MOSFET, VFET, nanowire FET, nanosheet FET, SET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "source-drain junctions" refer to the doped portions (doped with the same type of dopants as the source and drain regions) next to or into channel regions (e.g., fins, nanowires, etc.) of a vertical transistor device, such as, but not necessarily limited to, a VFET.

Embodiments of the present invention provide methods and structures for forming different bottom source-drain junction profiles for thick-oxide and thin-oxide devices. In a non-limiting illustrative example, thick gate oxide VFET devices may have about 2 nm to 10 nm thicker gate oxide layers than thin gate oxide VFET devices, which may have, for example gate oxides that are about 2 nm thick. Due to the different gate oxide thicknesses between thin and thick gate oxide devices, if the same junction formation process to form a junction in a thin-oxide device is used for a thicker oxide device, a bottom source-drain junction of the thick-oxide device would not penetrate high enough into a fin relative to a position of the bottom of a gate structure. In other words, dopant diffusion from a bottom side of a fin via diffusion from a heavily doped bottom source/drain region is not sufficient to create a source-drain junction profile in the fin which penetrates high enough into the fin to compensate for the thicker gate oxide on the bottom spacer. According to an exemplary embodiment of the present invention, a dummy spacer layer including, for example, PSG (phospho-silicate glass), BSG (boro-silicate glass) or BPSG (boro-phospho-silicate glass) is formed on the bottom source/drain region in a thick oxide device portion. The dummy spacer layer, since it is positioned on top of the bottom source drain region, provides dopants (e.g., phosphorous or boron) to be diffused into adjacent fins at a greater vertical height along the fins than the bottom source/region. As a result, in accordance with embodiments of the present invention, source-drain junction profiles in fins for thicker gate oxide devices penetrate higher in the fin to correspond to bottom surfaces of gate structures at greater vertical heights due to thicker underlying gate oxides. The embodiments of the present invention provide for structures and process flows to address the foregoing issues and ensure optimized junction profiles of both thick-oxide and thin-oxide devices.

FIG. 1 is a cross-sectional view of fin formation in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 105, can be formed by patterning a semiconductor layer into the fins 105. The semiconductor layer can include, but is not necessarily limited to, Si, SiGe or III-V materials, and may be epitaxially grown. According to an embodiment, a hardmask 110 including, for example, a dielectric material, such as silicon nitride (SiN) is formed on portions of the semiconductor layer that are to be formed into the fins 105. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited to, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. While embodiments of the present invention describe channel regions as fins, the embodiments are not necessarily limited to fin channel regions, and may include nanowire channel regions. In addition, although four fins 105 are shown in the figures for ease of explanation, more or less than four fins can be formed.

Figure 2:
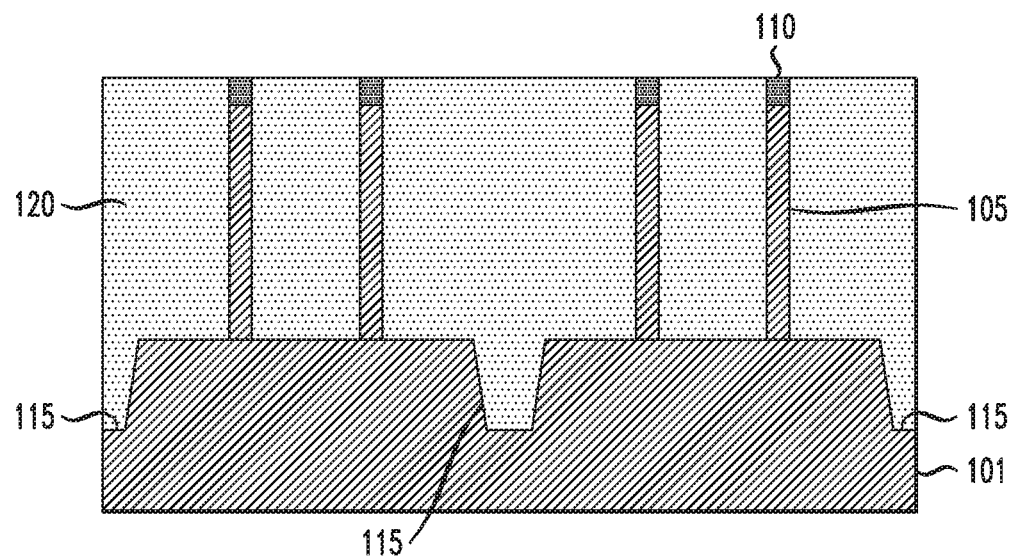
FIG. 2 is a cross-sectional view illustrating dielectric layer deposition and formation of isolation regions in a method of manufacturing a semiconductor device, according to an exemplary embodiment of the present invention.

FIG. 2 is a cross-sectional view illustrating dielectric layer deposition and formation of isolation regions in a method of manufacturing a semiconductor device, according to an exemplary embodiment of the present invention. Referring to FIG. 2, trenches 115 are formed in the substrate 101, by for example, a wet or dry etch process. A dielectric material layer 120, including, but not necessarily limited to silicon dioxide ($SiO_2$), low-temperature oxide (LTO), high-temperature oxide (HTO), flowable oxide (FOX), silicon oxycarbide (SiOC), silicon oxycarbonitride (SiOCN) or some other dielectric, is formed on the substrate 101 and in the trenches 115, and around the fins 105. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process down to the hardmasks 110, such as, chemical mechanical planarization (CMP) to remove excess dielectric material.

Figure 3:
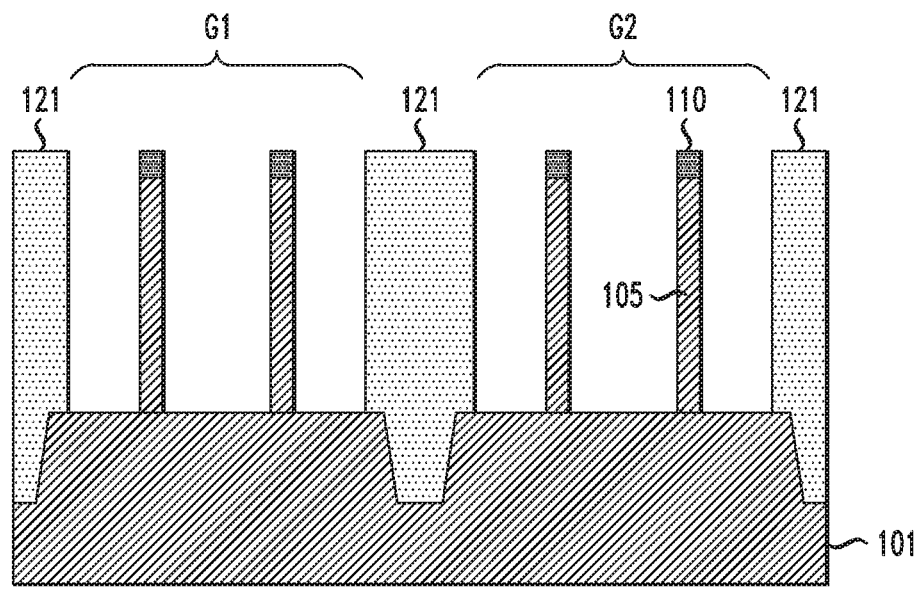
FIG. 3 is a cross-sectional view of patterning the dielectric layer into gate and isolation regions in a method of manufacturing a semiconductor device, according to an exemplary embodiment of the present invention.

FIG. 3 is a cross-sectional view of patterning the dielectric layer into gate and isolation regions in a method of manufacturing a semiconductor device, according to an exemplary embodiment of the present invention. Referring to FIG. 3, portions of the dielectric layer 120 are removed from around the fins 105 in what are the gate regions G1 and G2. The removal of the portions of the dielectric layer 120 from the gate regions G1 and G2 defines isolation regions 121, such as, for example, shallow trench isolation (STI) regions. The patterning of the dielectric layer 120 can be performed using appropriate masking and removal techniques, including, but not necessarily limited to, RIE and optical lithography.

Figure 4:
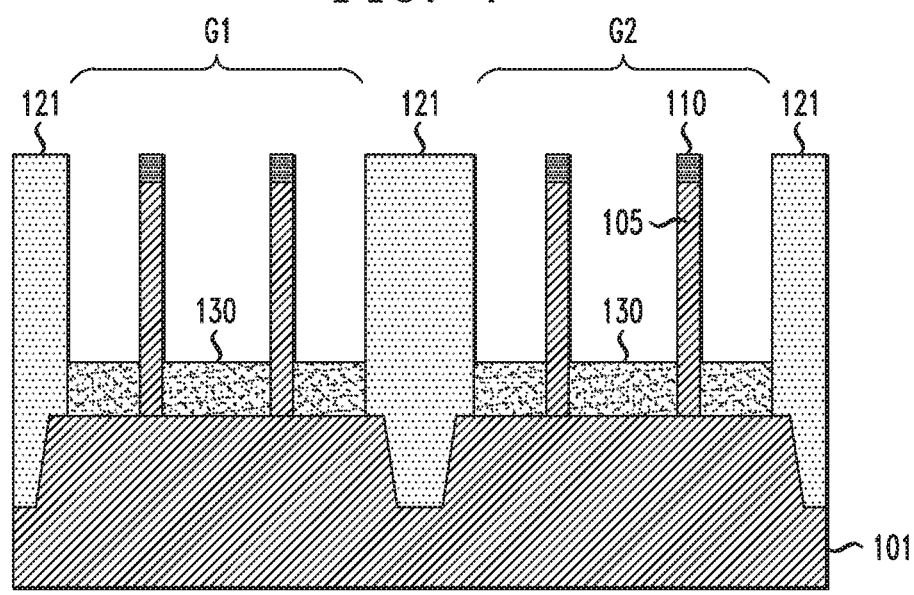
FIG. 4 is a cross-sectional view of bottom source/drain formation in a method of manufacturing a semiconductor device, according to an exemplary embodiment of the present invention.

FIG. 4 is a cross-sectional view of bottom source/drain formation in a method of manufacturing a semiconductor device, according to an exemplary embodiment of the present invention. Referring to FIG. 4, bottom source/drain regions 130 are formed in the gate regions G1 and G2 around the fins 105. The bottom source/drain regions 130 can be formed by a bottom-up epitaxial growth process (with optional dummy vertical dielectric liners covering fin sidewalls during epitaxial growth), wherein the bottom source/drain regions 130 are grown to certain height (thickness) such as, but not necessarily limited to about 10 nm to about 50 nm. The epitaxially grown bottom source/drain regions 130 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1e18/cm^3$ to $1e21/cm^3$.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

Figure 5:
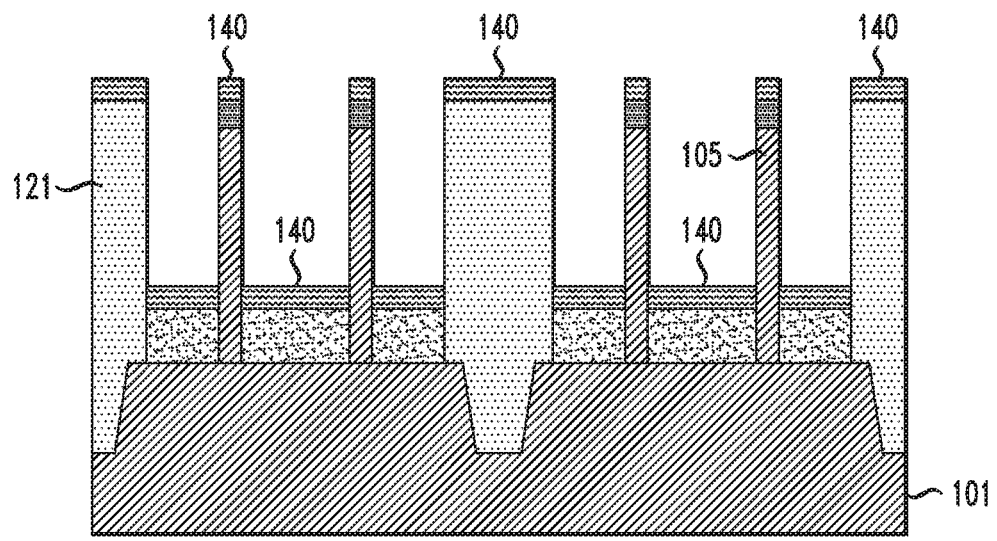
FIG. 5 is a cross-sectional view of dummy spacer formation in a method of manufacturing a semiconductor device, according to an exemplary embodiment of the present invention.

FIG. 5 is a cross-sectional view of dummy spacer formation in a method of manufacturing a semiconductor device, according to an exemplary embodiment of the present invention. Referring to FIG. 5, dummy spacer layers 140 are formed on exposed horizontal surfaces including isolation regions 121, the bottom source/drain regions 130 and on the hardmasks 110, which are on the fins 105. The material of the dummy spacer layer 140 includes, but is not necessarily limited to, PSG, BSG or BPSG, deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. In addition, an isotropic etch can be performed to remove any dummy spacer material that may have been formed on vertical surfaces, such as lateral sidewalls. In accordance with an embodiment of the present invention, a thickness of the dummy spacer layer 140 (i.e., vertical height) is about 2 nm to 15 nm. In accordance with an embodiment of the present invention, the dummy spacer layer 140 is doped with, for example, boron and/or phosphorous during deposition. The dopant concentrations of the PSG, BSG or BPSG can be for example in the general range of e17 to e22/cm$^3$ for both boron and phosphorus dopants.

Figure 6:
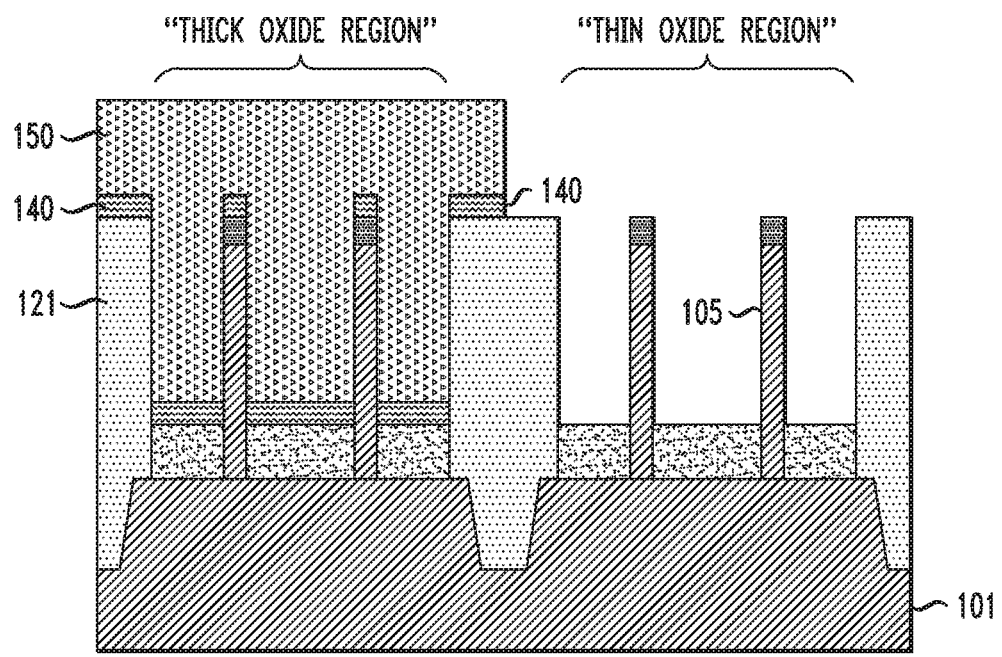
FIG. 6 is a cross-sectional view of dummy spacer removal from a thin oxide device region in a method of manufacturing a semiconductor device, according to an exemplary embodiment of the present invention.

FIG. 6 is a cross-sectional view of dummy spacer removal from a thin oxide device region in a method of manufacturing a semiconductor device, according to an exemplary embodiment of the present invention. Referring to FIG. 6, the dummy spacer layers 140 are removed from what is to become a region having a device(s) with a relatively thin gate oxide ("thin oxide region"). The dummy spacer layers 140 remain in what is to become a region having a device(s) with a relatively thick gate oxide ("thick oxide region"). As noted herein, a thick oxide region may include a gate oxide that is about 2 nm to 10 nm thicker than a gate oxide in a thin oxide region, which is about 2 nm thick. As shown in FIG. 6, an organic planarization layer (OPL) 150 is formed in the thick oxide region to cover (e.g., mask) the dummy spacer layers 140 in the thick oxide region so that the dummy spacer layers 140 in the thin oxide region can be removed while the covered dummy spacer layers 140 in the thick oxide region remain. The dummy spacer layers 140 in the thin oxide region can be removed using, for example, a reactive ion etch (RIE) process containing tetrafluoromethane ($CF_4$) or a wet etch process containing hydrofluoric acid (HF).

In accordance with an embodiment of the present invention, the OPL material may be an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL material can be deposited, for example, by spin coating. The OPL material can be patterned into the OPL 150 covering the thick oxide region by using an anisotropic removal process, such as, for example, a reactive ion etch (RIE) process, or by lithography and/or double patterning processes.

Figure 7:
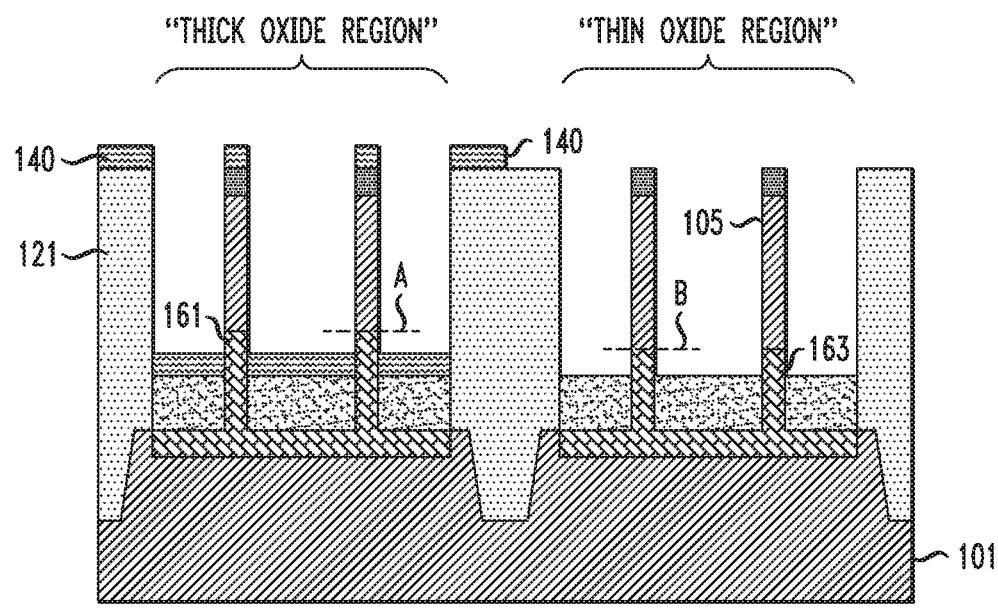
FIG. 7 is a cross-sectional view of removal of an organic planarization layer (OPL) and bottom junction drive-in annealing in a method of manufacturing a semiconductor device, according to an exemplary embodiment of the present invention.

FIG. 7 is a cross-sectional view of removal of an organic planarization layer (OPL) and bottom junction drive-in annealing in a method of manufacturing a semiconductor device, according to an exemplary embodiment of the present invention. Referring to FIG. 7, the OPL 150 is stripped using, for example, oxygen plasma, nitrogen plasma, hydrogen plasma or other carbon strip process. OPL stripping causes minimal or no damage to the fins 105 or the layers 121, 140 and 110. Following stripping of the OPL 150, bottom junction drive-in annealing is performed in both thick and thin oxide regions to form bottom source-drain junctions 161 and 163 in thick and thin oxide regions, respectively. As can be seen in FIG. 7 by comparing lines A and B, due to the dummy spacer layer 140 comprising BSG, PSG or BPSG, the source-drain junctions 161 in the thick oxide region penetrate into the fins 105 at a greater height than the source-drain junctions 163 in the thin oxide region. As shown in FIG. 7, the resulting height of the upper edges of the source-drain junctions 161 on the fins 105 in the thick oxide region is greater than the resulting height of the upper edges of the source-drain junctions 163 in the thin oxide region.

The source-drain junctions 161 are formed by dopant diffusion into the fins 105 from the dummy spacer layer 140 and a bottom source/drain region 130, while the source-drain junctions 163 are formed by dopant diffusion into the fins 105 from the bottom source/drain region 130 and not from a dummy spacer layer 140. A doping concentration can be higher at areas of the fins 105 closer to the source/drain regions 130 than at areas of the fins farther away from the source/drain regions 130. The drive-in annealing process can be performed at temperatures in the range of, for example, about 800° C. to 1300° C. and in durations in the range of, for example, about 0.01 seconds to 10 minutes.

Figure 8:
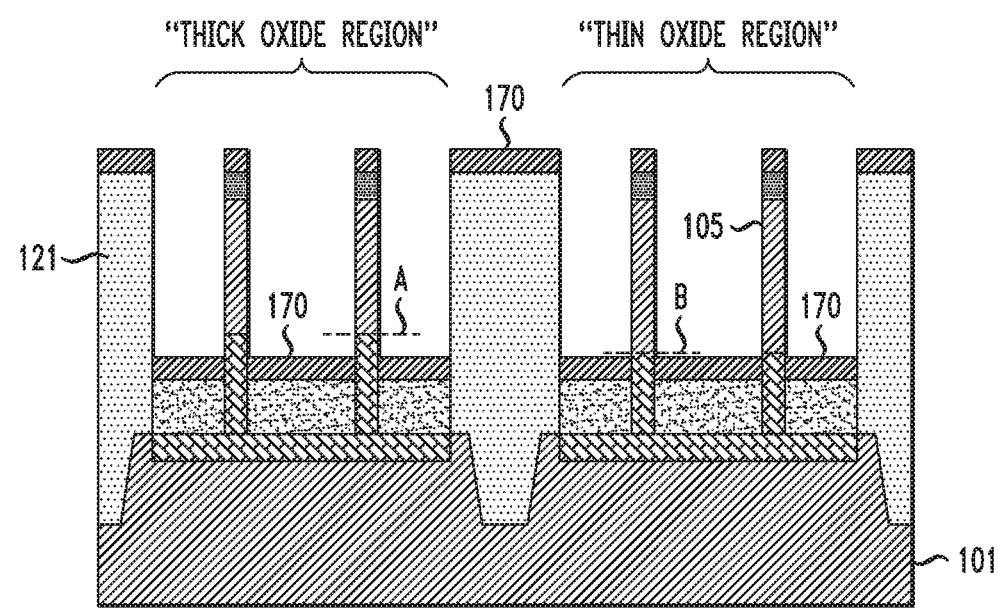
FIG. 8 is a cross-sectional view of dummy spacer removal from a thick oxide device region and bottom spacer formation in a method of manufacturing a semiconductor device, according to an exemplary embodiment of the present invention.

FIG. 8 is a cross-sectional view of dummy spacer removal from a thick oxide device region and bottom spacer formation in a method of manufacturing a semiconductor device, according to an exemplary embodiment of the present invention. Referring to FIG. 8, the dummy spacer layers 140 are selectively removed from the thick oxide region using, for example, an etching process, such as, a reactive ion etch (RIE) process containing tetrafluoromethane ($CF_4$) or a wet etch process containing hydrofluoric acid (HF).

Spacer material 170 is formed on exposed horizontal surfaces including isolation regions 121, the bottom source/drain regions 130 and on the hardmasks 110, which are on the fins 105. Spacer material 170 includes, but is not necessarily limited to, plasma enhanced chemical vapor deposition (PECVD)-type, high aspect ratio process (HARP)-type or high density plasma (HDP)-type low-K dielectric layers, including, but not limited to, silicon boron nitride (SiBN), siliconborocarbonitride (SiBCN), silicon oxycarbonitride (SiOCN), SiN or $SiO_2$. The spacer material 170 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. The spacer material 170 formed on isolation regions 121 and on the hardmasks 110 will later be removed during the CMP of gate stack materials, leaving the spacer material 170 on the bottom source/drain regions 130. The spacer material 170 on the bottom source/drain regions 130 is herein referred to as bottom spacer layers or bottom spacers 170.

FIG. 9 is a cross-sectional view of gate structure formation in a method of manufacturing a semiconductor device, according to an exemplary embodiment of the present invention. Referring to FIG. 9, the gate structures include gate layers 175, 176 and gate oxide layers 181, 182 are formed in the thick and thin oxide regions. As can be seen, as shown by a comparison of t1 and t2, the gate oxide layers 181 are thicker (e.g., about 2 nm to 10 nm thicker) than the gate oxide layers 182. In accordance with an embodiment of the present invention, the gate oxide layers 181, 182 include an interfacial dielectric layer including, but not necessarily limited to, $SiO_2$ (silicon dioxide), a high-K dielectric layer including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate layers 175, 176 include, for example, a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers 175, 176 further include a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures are deposited on the spacers 170 on and around the fins 105, and on the isolation regions 121, using, for example, deposition techniques including, but not limited to, CVD, PECVD, RFCVD, PVD, ALD, MLD, MBD, PLD, LSMCD, sputtering, and/or plating. A planarization process, such as, for example, CMP, is performed to remove excess portions of the gate structures and spacer material 170 on the hardmasks 110 and on the isolation regions 121 to result in the structure shown in FIG. 9.

In accordance with an embodiment of the present invention, in order to form the different gate structures including the gate oxide layers 181, 182 having different thicknesses from each other, block masks are used during gate oxide deposition. For example, the thick oxide region can be masked during deposition of the gate oxide 182, and the thin oxide region can be masked during deposition of the gate oxide 181.

FIG. 10 is a cross-sectional view of recessing of gate structures in a method of manufacturing a semiconductor device, according to an exemplary embodiment of the present invention. Referring to FIG. 10, portions of the gate structures including the gate layers 175, 176 and the gate oxide layers 181, 182, are removed using, for example, an anisotropic etch process, such as RIE, ion beam etching, plasma etching or laser ablation. As can be seen, the gate structures are recessed to a lower height above the substrate 101. According to an embodiment, recessing is performed by a wet or dry etching process that is selective with respect to materials of the fins 105, the isolation layers 121 and the hardmasks 110. Etch chemistry for recessing the gate structures can include, for example, sulfur hexafluoride ($SF_6$) and nitrogen ($N_2$).

Figure 11:
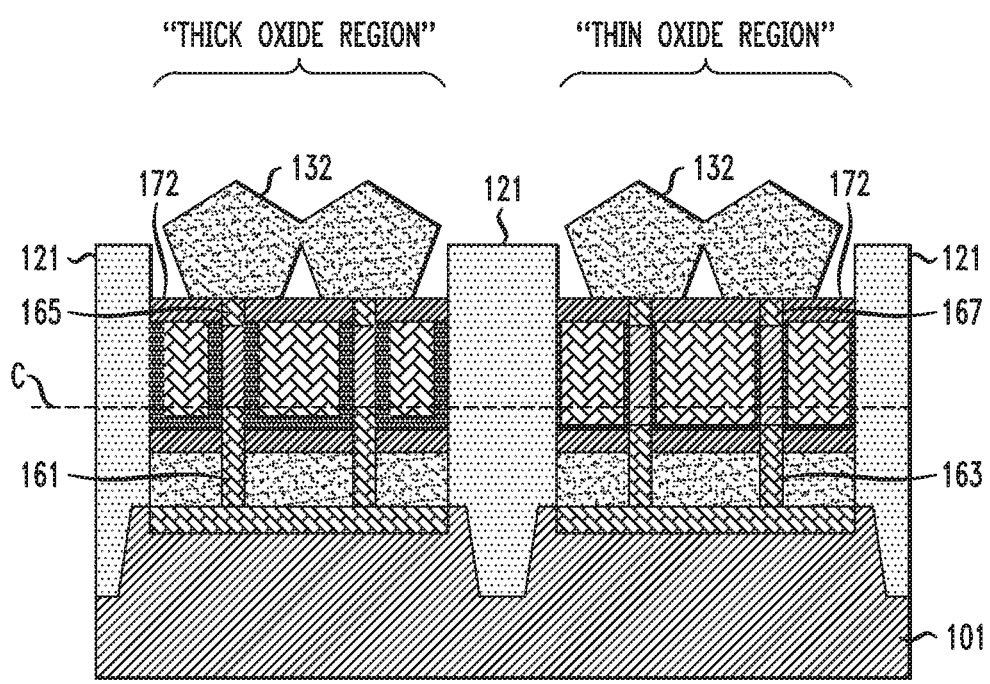
FIG. 11 is a cross-sectional view of formation of top spacers, top source/drain regions and top source-drain junctions in a method of manufacturing a semiconductor device, according to an exemplary embodiment of the present invention.

FIG. 11 is a cross-sectional view of formation of top spacers, top source/drain regions and top source-drain junctions in a method of manufacturing a semiconductor device, according to an exemplary embodiment of the present invention. Referring to FIG. 11, spacer material is formed on exposed horizontal surfaces including isolation regions 121, the gate structures and on the hardmasks 110, which are on the fins 105. Spacer material includes, but is not necessarily limited to, PECVD-type, HARP-type or HDP-type low-K dielectric layers, including, but not limited to, SiBN, SiBCN, SiOCN, SiN or $SiO_2$. The spacer material is deposited using, for example, directional deposition techniques, including, but not necessarily limited to HDP deposition and GCIB deposition. The directional deposition deposits the spacer material preferably on the exposed horizontal surfaces, but not on lateral sidewalls. The spacer material formed on isolation regions 121 and on the hardmasks 110 will later be removed by CMP, leaving the spacer material 172 on the gate structures. The spacer material 172 on the gate structures is herein referred to as top spacer layers or top spacers 172.

The hardmasks 110 are selectively removed, using for example, a selective etch process. The selective etch process can include, for example, a wet etch process containing phosphoric acid at a temperature around 80° C. Upper portions of the fins 105 may be optionally removed using, for example, an anisotropic etch process, such as RIE, ion beam etching, plasma etching or laser ablation. The fins 105 can be recessed to a height above the substrate 101 near an upper surface of the top spacer layer 172. The recessing can result in a height of the fins 105 which is at, or slightly above or below the upper surface of the top spacer layer 172. According to an embodiment, recessing is performed by a wet or dry etching process that is selective with respect to the materials of the isolation regions 121 and the spacer layers 172. Etch chemistry for recessing the fins 105 can include, for example, chlorine gas. According to an embodiment of the present invention, the recessing of the fins 105 is not performed, and the method proceeds from the hardmask removal to epitaxial growth of a top source/drain region 132 without recessing the fins 105.

Top source/drain regions 132 are epitaxially grown on the fins 105 and on the spacer layers 172 between isolation regions 121. In accordance with an embodiment of the present invention, for an nFET, an As or P doped Si or SiC source/drain region 132 is epitaxially grown. For a pFET, a B doped SiGe or Si source/drain region 132 is epitaxially grown. Doping can be at concentrations in the general range of e19 to e21/cm$^3$.

Top junction drive-in annealing or dopant implantation is performed in both thick and thin oxide regions to form top source-drain junctions 165 and 167 in thick and thin oxide regions, respectively.

Referring to line C in FIG. 11, an upper edge of the source-drain junction 161 in the thick oxide region remains at a greater height on the fins than an upper edge of the source-drain junction 163 in the thin oxide region.

The top source-drain junctions 165 and 167 are formed by dopant diffusion or implantation into the top portion of the fins 105 from the top source/drain regions 132. A doping concentration can be higher at areas of the fins 105 closer to the source/drain regions 132 than at areas of the fins farther away from the source/drain regions 132.

As can be understood further downstream processing can be performed to form inter-level dielectric (ILD) layers and electrically conductive contact regions to gate structures and source/drain regions.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
a plurality of vertical transistors on a substrate, wherein each of the plurality of vertical transistors comprises:
a channel region extending vertically from the substrate, wherein the channel region includes a junction portion extending vertically from a bottom of the channel region;
a bottom source/drain region on the substrate and around a lower portion of the channel region;
a gate structure on the bottom source/drain region, wherein the gate structure comprises a gate oxide layer; and
a top source/drain region on the gate structure and extending from the channel region;
wherein a junction portion corresponding to a first vertical transistor of the plurality of vertical transistors extends to a greater height above a corresponding bottom source/drain region of the first vertical transistor than a junction portion corresponding to a second vertical transistor of the plurality of vertical transistors.

2. The semiconductor device according to claim 1, wherein a gate oxide layer of the first vertical transistor is thicker than a gate oxide layer of the second vertical transistor.

3. The semiconductor device according to claim 2, wherein a gate oxide layer of the first vertical transistor is about 2 nm to about 10 nm thicker than the gate oxide layer of the second vertical transistor.

4. The semiconductor device according to claim 1, wherein a height of a top surface of a given gate structure is less than a height of a top surface of a given channel region corresponding to the given gate structure.

5. The semiconductor device according to claim 1, wherein each channel region comprises a fin.

6. The semiconductor device according to claim 1, wherein each of the plurality of vertical transistors further comprises a bottom spacer layer disposed on the bottom source/drain region between the bottom source/drain region and the gate structure.

7. The semiconductor device according to claim 1, wherein each of the plurality of vertical transistors further comprises a top spacer layer disposed on the gate structure between the gate structure and the top source/drain region.

8. The semiconductor device according to claim 1, wherein the junction portion corresponding to the first vertical transistor and the junction portion corresponding to the second vertical transistor comprise respective bottom source/drain junction portions of the first and second vertical transistors.

9. The semiconductor device according to claim 8, wherein each of the plurality of vertical transistors further comprises a top source/drain junction portion at an upper portion of the channel region.

10. A semiconductor device, comprising:
a first channel region disposed on a substrate and extending vertically from the substrate, wherein the first channel region includes a first source/drain junction portion extending vertically from a bottom of the first channel region to a first height;
a second channel region disposed on the substrate and extending vertically from the substrate, wherein the second channel region includes a second source/drain junction portion extending vertically from a bottom of the second channel region to a second height;
wherein the first height is greater than the second height; and
wherein bottom surfaces of the first and second channel regions are coplanar.

11. The semiconductor device according to claim 10, wherein the first channel region corresponds to a first vertical transistor, and the second channel region corresponds to a second vertical transistor.

12. The semiconductor device according to claim 11, further comprising an isolation region between the first vertical transistor and the second vertical transistor.

13. The semiconductor device according to claim 10, further comprising:
a first gate structure formed around the first channel region and comprising a first gate dielectric layer;
a second gate structure formed around the second channel region and comprising a second gate dielectric layer;
wherein the first gate dielectric layer is thicker than the second gate dielectric layer.

14. The semiconductor device according to claim 13, wherein the first gate dielectric layer is about 2 nm to about 10 nm thicker than the second gate dielectric layer.

15. The semiconductor device according to claim 10, further comprising:
a first bottom source/drain region on the substrate and around a lower portion of the first channel region; and
a second bottom source/drain region on the substrate and around a lower portion of the first channel region;
wherein the first and second bottom source/drain regions are at the same height on the substrate.

16. The semiconductor device according to claim 15, further comprising:
a first bottom spacer layer disposed on the first bottom source/drain region; and
a second bottom spacer layer disposed on the second bottom source/drain region.

17. The semiconductor device according to claim 10, wherein top surfaces of the first and second channel regions are at the same height on the substrate.

18. The semiconductor device according to claim 17, further comprising first and second top source/drain regions respectively on the top surfaces of the first and second channel regions.

19. The semiconductor device according to claim 18, further comprising first and second top source/drain junction portions at upper portions of the first and second channel regions, respectively.

20. The semiconductor device according to claim 10, wherein the first and second channel regions comprise first and second fins.

* * * * *